United States Patent [19]

Ten Eyck

[11] Patent Number: 5,070,261
[45] Date of Patent: Dec. 3, 1991

[54] APPARATUS AND METHOD FOR TRANSLATING VOLTAGES

[75] Inventor: Timothy A. Ten Eyck, Sherman, Tex.

[73] Assignee: Texas Instruments Incorporated, Dallas, Tex.

[21] Appl. No.: 622,046

[22] Filed: Dec. 4, 1990

[51] Int. Cl.[5] ............... H03K 14/086; H03K 14/0175
[52] U.S. Cl. .................................. 307/475; 307/446; 307/455
[58] Field of Search ............... 307/475, 446, 451, 443, 307/362–363, 455

[56] References Cited

U.S. PATENT DOCUMENTS

| | | | |
|---|---|---|---|
| 4,797,579 | 1/1989 | Lewis | 307/475 |
| 4,839,537 | 6/1989 | Ueno | 307/446 |
| 4,987,324 | 1/1991 | Wong et al. | 307/451 |

OTHER PUBLICATIONS

"High Performance BiCMOS 100k-Gate Array", Gallia et al., IEEE Journal of Solid-State Circuits, vol. 25, No. 1, Feb. 1990, pp. 142-149.

"An 8-ns 256K BiCMOS RAM", Tamba et al., IEEE Journal of Solid-State Circuits, vol. 24, No. 4, Aug. 1989, pp. 1021-1026.

Primary Examiner—David Hudspeth
Assistant Examiner—Andrew Sanders
Attorney, Agent, or Firm—B. Peter Barndt; James T. Comfort; Melvin Sharp

[57] ABSTRACT

An apparatus and method for translating voltages between logic levels is provided having an input section (11), a level shifter section (89) and an output section (137). Input section (11) provides two control voltages to the level shifter section (89) in response to an input signal provided at input terminal (12). Level shifter section (89) comprises two inverters coupled to the control voltages. One inverter comprises p channel field-effect transistor (90) and n channel field-effect transistor (98). Another inverter comprises p channel field-effect transistor (106) and n channel field-effect transistor (114). For each inverter, the channel of the p channel field-effect transistor is over twice as wide as the channel of the n channel field-effect transistors. Each transistor (90, 98, 106 and 114) conducts current in response to a control voltage being anywhere within the voltage range, such that outputs of the inverters transition quickly in reponse to a transition of the control voltages. Output section (137) generates an output signal in response to the inverter outputs.

19 Claims, 1 Drawing Sheet

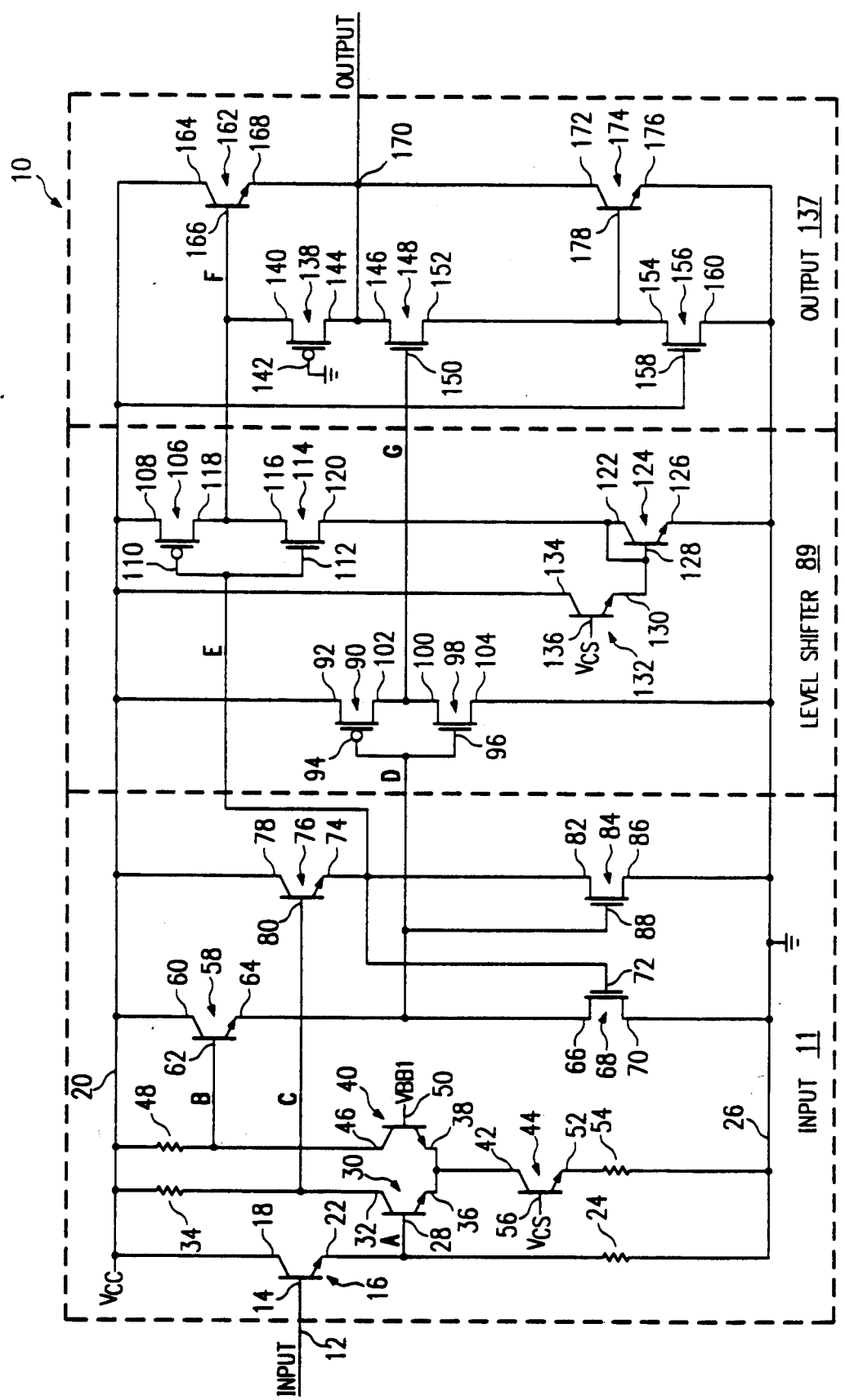

APPARATUS AND METHOD FOR TRANSLATING VOLTAGES

TECHNICAL FIELD OF THE INVENTION

This invention relates in general to the field of electronic circuitry, and more particularly to voltage level translators.

BACKGROUND OF THE INVENTION

In contemporary digital circuit applications, it is common to combine various logic structures using, for example, ECL, CMOS and TTL design. While CMOS and TTL are generally compatible, ECL uses substantially different voltages to represent a logical high and a logical low. In conventional ECL, −1.7 volts is used to represent a logical low and −0.95 volts is used to represent a logical high. Pseudo-ECL logic may also be used in order to take advantage of existing voltage supply rails. For example, with 0 volt and 5 volt supply rails, a pseudo-ECL circuit would use a signal of 3.3 volts for a logical low and a signal of 4.05 volts for logical high.

Because different voltages are often used in a single circuit, it is necessary to provide circuitry for translating ECL signals to suitable CMOS or TTL counterparts. Various circuits have been designed to translate the ECL signals to CMOS-compatible or TTL-compatible signals. An ECL signal, however, must propagate through the translator to the inputs of the CMOS or TTL circuits. Consequently, the propagation delay time through the translator becomes very important.

Translation propagation times of 1-2 nanoseconds are considered short for modern technology. Nonetheless, a propagation delay of this magnitude may be unacceptable for many applications.

Therefore, a need has arisen for a circuit and method for providing ECL-to-CMOS/TTL translations such that the propagation delay associated with both low-to-high transitions and high-to-low transitions is minimized.

SUMMARY OF THE INVENTION

In the present invention, a method and apparatus for translating voltages is provided comprising an input section for generating first and second control voltages within a voltage range responsive to an input signal. A level shifter section comprises first and second inverters respectively coupled to said control voltages, said inverters comprising a plurality of transistors, wherein each transistor maintains current responsive to one of said control voltages being anywhere within said voltage range, such that outputs of said first and second inverters are operable to transition quickly responsive to a transition of said first and second control voltages, respectively. An output section generates an output signal responsive to said outputs of said first and second inverters.

The present invention provides the technical advantage of a significantly lower propagation delay associated with both low-to-high and high-to-low input transitions. The present invention is compatible with ECL-to-CMOS and ECL-to-TTL conversions.

BRIEF DESCRIPTION OF THE DRAWING

For a more complete understanding of the present invention, and the advantages thereof, reference is now made to the following description taken in conjunction with the accompanying drawing, in which:

FIG. 1 is a schematic illustrating an ECL-to-CMOS/TTL voltage level translator with high current drive capability.

DETAILED DESCRIPTION OF THE INVENTION

The preferred embodiment of the present invention and its advantages are best understood by referring to FIG. 1.

FIG. 1 is a schematic illustrating an ECL-to-CMOS/TTL voltage level translator 10 with high current drive capability. Input section 11 of voltage level translator 10 begins at input terminal 12, which is coupled to base 14 of npn transistor 16. Npn transistor 16 has a collector 18 coupled to first voltage line 20 (shown as $V_{cc}$), and an emitter 22 coupled through resistor 24 to second voltage line 26 (shown as ground). Emitter 22 of npn transistor 16 is also coupled to base 28 of npn transistor 30 at node A. Npn transistor 30 has a collector 32 coupled to first voltage line 20 through resistor 34, and an emitter 36 coupled to emitter 38 of npn transistor 40 and further coupled to collector 42 of npn transistor 44. Npn transistor 40 has a collector 46 coupled to first voltage line 20 through resistor 48, and a base 50 coupled to reference voltage $V_{bb1}$. Emitter 52 of npn transistor 44 is coupled through resistor 54 to second voltage line 26. Base 56 of npn transistor 44 is coupled to voltage $V_{cs}$.

Npn transistor 58 has a collector 60 coupled to first voltage line 20, and a base 62 coupled to collector 46 of npn transistor 40 at node B. Emitter 64 of npn transistor 58 is coupled to drain 66 of n channel field effect transistor (FET) 68. N channel FET 68 has a source 70 coupled to second voltage line 26, and a gate 72 coupled to emitter 74 of npn transistor 76. Npn transistor 76 has a collector 78 coupled to first voltage line 20, and a base 80 coupled to collector 32 of npn transistor 30 at node C. Emitter 74 of npn transistor 76 is further coupled to drain 82 of n channel FET 84. N channel FET 84 has a source 86 coupled to second voltage line 26, and a gate 88 coupled to emitter 64 of npn transistor 58.

Level shifter section 89 receives signals at nodes D and E. P channel FET 90 has a source 92 coupled to first voltage line 20, and a gate 94 coupled to gate 96 of n channel FET 98 and further coupled to emitter 64 of npn transistor 58 at node D. N channel FET 98 has a drain 100 coupled to drain 102 of p channel FET 90. Source 104 of n channel FET 98 is coupled to second voltage line 26.

P channel FET 106 has a source 108 coupled to first voltage line 20, and a gate 110 coupled to gate 112 of n channel FET 114 and further coupled to emitter 74 of npn transistor 76 at node E. N channel FET 114 has a drain 116 coupled to drain 118 of p channel FET 106. Source 120 of n channel FET 114 is coupled to collector 122 of npn transistor 124. Npn transistor 124 has an emitter 126 coupled to second voltage line 26, and a base 128 coupled to collector 122 of npn transistor 124 and to emitter 130 of npn transistor 132. Npn transistor 132 has a collector 134 coupled to first voltage line 20 and a base 136 coupled to voltage $V_{cs}$.

Output section 137 receives signals at nodes F and G. P channel FET 138 has a source 140 coupled to drain 118 of p channel FET 106 and further coupled to drain 116 of n channel FET 114 at node F. Gate 142 of p channel FET 138 is coupled to second voltage line 26

Drain 144 of p channel FET 138 is coupled to drain 146 of n channel FET 148. N channel FET 148 has a gate 150 coupled to drain 102 of p channel FET 90 and further coupled to drain 100 of n channel FET 98 at node G. Source 152 of n channel FET 148 is coupled to drain 154 of n channel FET 156. N channel FET 156 has a gate 158 coupled to first voltage line 20, and a source 160 coupled to second voltage line 26. Npn transistor 162 has a collector 164 coupled to first voltage line 20, and a base 166 coupled to node F. Emitter 168 of npn transistor 162 is coupled to output terminal 170. Output terminal 170 is further coupled to drain 144 of p channel FET 138 and to drain 146 of n channel FET 148. Collector 172 of npn transistor 174 is also coupled to output terminal 170. Npn transistor 174 has an emitter 176 coupled to second voltage line 26, and a base 178 coupled to source 152 of n channel FET 148 and further coupled to drain 154 of n channel FET 156.

For purposes of explaining operation of translator 10, the voltage level provided at input terminal 12 is assumed to be a pseudo-ECL signal ranging between 3.29 volts and 4.02 volts. Although voltage level translator 10 will be described in connection with the pseudo-ECL voltage levels defined above, other voltage levels could also be provided at input terminal 12. For example, first voltage line 20 can be set to 0 volts, second voltage line 26 can be set to −5 volts, $V_{bb1}$ can be set to −2.14 volts, and $V_{cs}$ can be set to −3.705 volts, resulting in CMOS inverted voltage levels at output terminal 170 ranging between −0.14 volts and −4.93 volts corresponding to standard ECL voltage levels at input terminal 12 ranging between −0.95 volts and −1.7 volts.

In the illustrated embodiment, first voltage line is set to 5 volts, second voltage line is set to 0 volts, $V_{bb1}$ is set to 2.86 volts, and $V_{cs}$ is set to 1.295 volts, resulting in CMOS voltage levels at output terminal 170 ranging between 4.86 volts and 0.07 volts corresponding to pseudo-ECL voltage levels at input terminal 12 ranging between 4.02 volts and 3.29 volts. Furthermore, the voltages provided at output terminal 170 ranging between 4.86 volts and 0.07 volts are compatible with TTL circuits.

In operation, transistor 16 of input section 11 operates to reduce the voltage provided at input terminal 12 by one $V_{be}$ (approximately 0.85 volts), thereby conserving power. Transistors 30 and 40 operate together as a differential amplifier which compares the voltage at node A with $V_{bb1}$. $V_{bb1}$ is a reference voltage set to determine whether the voltage at node A is a logic high or a logic low signal. Transistor 44 acts as a current source to the differential amplifier. In the preferred embodiment, $V_{cs}$ is set to approximately 1.295 volts which draws a higher current than conventional ECL input circuits. This higher current combines with increased values in resistors 34 and 48 to increase the voltage drop across resistors 34 and 48, thereby increasing the signal swings at nodes C and B, respectively.

Either transistor 30 or transistor 40 supplies the required current to transistor 44, depending on whether the voltage at node A is greater than or less than $V_{bb1}$. If node A is at a voltage greater than $V_{bb1}$ (i.e., the input is a logical high), then the voltage at node B equals the voltage of first voltage line 20 (i.e., 5 volts) and the voltage at node C equals approximately 3.62 volts (which may be adjusted by varying the values of $V_{cs}$ and resistor 34). Conversely, if the input is a logic low, node C has a voltage of approximately 5 volts and node B has a voltage of 3.62 volts (which may be adjusted by varying the values of $V_{cs}$ and resistor 48). In the preferred embodiment, each of resistors 34 and 48 has a resistance of 1,958 ohms, resistor 54 has a resistance of 585 ohms, and resistor 24 has a resistance of 9,375 ohms.

Transistors 58 and 76 are configured as emitter-followers, which reduce the voltages at each of nodes B and C by one $V_{be}$. N channel transistors 68 and 84 function as active loads to emitter-follower transistors 58 and 76, respectively. The loads provided by transistors 68 and 84 adjust as needed according to voltages at nodes D and E, thereby conserving power.

Transistors 90 and 98 form a CMOS inverter which inputs the signal at node D. Similarly, transistors 106 and 114 form a CMOS inverter which inputs the signal at node E. As described in greater detail hereinbelow, in order to increase the speed of the circuit, the two CMOS inverters have trip voltages which are skewed higher than the normal CMOS inverter trip voltage of 2.5 volts. Transistors 132 and 124 maintain node F (the output of the inverter formed by transistors 106 and 114) above a bias voltage of 0.8 volts, which is the voltage potential between base 128 and emitter 126 of transistor 124.

Transistors 162 and 174 accelerate the output transition time for output terminal 170. If node F is at a logic high, then transistor 162 quickly pulls output terminal 170 to one $V_{be}$ under the voltage of first voltage line 20. P channel transistor 138 further pulls output terminal 170 to the voltage at node F (approximately 4.86 volts). Conversely, if the voltage at node G (the output of the inverter formed by transistors 90 and 98) is near a logical high, transistor 174 pulls output terminal 170 to one $V_{be}$ over the voltage of second voltage line 26. Transistor 156, together with transistor 148, further pulls output terminal 170 toward the voltage of second voltage line 126.

The operation of the circuit will be described for both logical high and logical low signals provided at input terminal 12. If input terminal 12 is provided a logical low signal (i.e., 3.29 volts), then transistor 16 conducts, and node A has a voltage of 2.44 volts. With node A at 2.44 volts, thus falling below the 2.86 volts at $V_{bb1}$, transistor 30 does not conduct, and transistor 40 does conduct and therefore supplies required current to transistor 44. Since transistor 30 does not conduct, the voltage level at node C is 5 volts. While transistor 40 conducts, the voltage level at node B is 3.62 volts, because of a 1.38 volt drop across resistor 48. Even larger voltage level differences between node B and node C can be achieved by further increasing the value of resistor 48 and the current flow through transistor 44.

The voltage potential between base 62 and emitter 64 of transistor 58 is 0.85 volts. Similarly, the voltage potential between base 80 and emitter 74 of transistor 76 is also 0.85 volts. Therefore, since the voltage at node B is 3.62 volts, the voltage at node D is 2.77 volts. Since the voltage at node C is 5 volts, the voltage at node E is 4.15 volts. Transistors 68 and 84 function as low power active pull-downs for transistors 58 and 76, respectively.

For a typical CMOS inverter, the ratio of channel width for a p channel transistor compared to an n channel transistor is set to 2:1. In the preferred embodiment, the ratio of channel width for p channel transistor 90 compared to n channel transistor 98 is set at 7.72:1, which correspondingly decreases the ratio of voltage level drop across transistor 90 compared to transistor 98. The inverter formed by transistors 90 and 98 is thus set to a trip voltage (the voltage at which the inverter switches its logical output levels) skewed higher than the normal CMOS inverter trip voltage of 2.5 volts. The 2.77 volts applied to gates 94 and 96 causes both transistors 90 and 98 to conduct current, but transistor 90 conducts with less resistance than transistor 98 and therefore less voltage drop.

Since transistor 90 conducts current with less voltage drop than transistor 98, node G is pulled toward the voltage of first voltage line 20. While the voltage at node D is 2.77 volts, node G is approximately 4.2 volts, because of a 0.8 volt drop across transistor 90.

In the preferred embodiment, the ratio of channel width for p channel transistor 106 compared to n channel transistor 114 is set to 9.6:1, which correspondingly decreases the ratio of voltage level drop across transistor 106 compared to transistor 114. The inverter formed by transistors 106 and 114 is thus set to a trip voltage skewed higher than the normal CMOS inverter trip voltage of 2.5 volts. The 4.15 volts applied to gates 110 and 112 causes transistor 114 to almost fully conduct current, while transistor 106 conducts slightly.

While transistor 106 slightly conducts and transistor 114 almost fully conducts, node F is pulled toward the voltage of second voltage line 26, subject to the voltage potential between base 128 and emitter 126 of transistor 124. Thus, in this situation, node F has a voltage of approximately 0.8 volts.

Since the voltage at node F is 0.8 volts, transistor 162 does not conduct. In this case, the corresponding 4.2 volt level at node G causes transistor 148 to conduct. Therefore, the voltage of output terminal 170 is coupled to base 178 of transistor 174, thereby causing transistor 174 to conduct (assuming output terminal 170 was previously in a logical high state). Bipolar transistor 174 quickly pulls output terminal 170 toward the voltage of second voltage line 26, subject to the voltage potential between base 178 and emitter 176, which approximates 0.7 volts. While transistors 148 and 156 are also conducting, output terminal 170 is eventually pulled further toward the voltage of second voltage line 26 to approximately 70 millivolts. Transistor 174 therefore provides this voltage level translator 10 with high current drive capability, while transistors 148 and 156 pull output terminal 170 to a desired low voltage.

If input terminal 12 is provided a logical high signal (i.e., 4.02 volts), then transistor 16 conducts, and node A has a voltage of 3.17 volts. With node A at 3.17 volts, thus rising above the 2.86 volts at $V_{bb1}$, transistor 30 conducts and therefore supplies required current to transistor 44, and transistor 40 does not conduct. Since transistor 40 does not conduct, the voltage level at node B is 5 volts. While transistor 30 conducts, the voltage level at node C is 3.62 volts, because of a 1.38 volt drop across resistor 34. Even larger voltage level differences between node B and node C can be achieved by further increasing the value of resistor 34 and the current flow through transistor 44.

Since the voltage at node B is 5 volts, the voltage at node D is 4.15 volts. Transistor 90 slightly conducts, and transistor 98 almost fully conducts. Therefore, node G is pulled toward the voltage of second voltage line 26. Thus, in this situation, node G has a voltage of approximately 43 millivolts, because of a 43 millivolt drop across transistor 98.

Since the voltage at node C is 3.62 volts, the voltage at node E is 2.77 volts. Transistor 106 conducts current with less voltage drop than transistor 114. Therefore, node F is pulled toward the voltage of first voltage line 20. While the voltage at node E is 2.77 volts, node F is approximately 4.86 volts, because of a 0.14 volt drop across transistor 106.

Since the voltage at node G is 43 millivolts, transistor 148 does not conduct, nor do transistors 156 and 174. In this case, the corresponding 4.86 volt level at node F causes transistor 162 to conduct, along with transistor 138. Bipolar transistor 162 quickly pulls output terminal 170 toward the voltage of first voltage line 20, subject to the voltage potential between base 166 and emitter 168, which approximates 0.7 volts. While transistor 138 also conducts, output terminal 170 is eventually pulled further toward the voltage at node F to approximately 4.86 volts. Transistor 162 therefore provides this voltage level translator 10 with high current drive capability, while transistor 138 pulls output terminal 170 to a desired high voltage. Transistor 174 does not conduct because the voltage on node G is less than the 0.7 volt $V_{be}$ between base 178 and emitter 176 of transistor 174.

The voltage level translator 10 has a nominal propagation delay of under 500 picoseconds with a nominal power dissipation of 12.5 milliwatts. This 500 picosecond delay is partially achieved by increasing the ratio of channel width for p channel transistor 90 compared to n channel transistor 98. This increased ratio of channel widths enables both transistors 90 and 98 to conduct current even when the voltage at node D is only as low as 2.77 volts, which produces a voltage at node G of 4.2 volts sufficient to drive output section 137. Conversely, when the voltage at node D is 4.15 volts, transistor 98 almost fully conducts while transistor 90 conducts slightly, which produces a voltage at node G of approximately 43 millivolts sufficient to operate output section 137. Therefore, the increased ratio of channel width for p channel transistor 90 compared to n channel transistor 98 effectively narrows the voltage range necessary for node D to sufficiently operate output section 137, and this increased ratio also allows both transistors 90 and 98 to conduct current for all voltages within the narrowed voltage range of node D, thus shortening the required transition time for transistors 90 and 98 to fully adjust to a new voltage at node D.

Similarly, the 500 picosecond delay is further achieved by increasing the ratio of channel width for p channel transistor 106 compared to n channel transistor 114. This increased ratio effectively narrows the voltage range necessary for node E to sufficiently operate output section 137, and it also allows both transistors 106 and 114 to conduct current for all voltages within the narrowed voltage range of node E, thus shortening the required transition time for transistors 106 and 114 to fully adjust to a new voltage at node E.

Furthermore, the 500 picosecond delay is achieved by inserting transistor 124 to provide a voltage potential between base 128 and emitter 126 of transistor 124. This voltage potential maintains node F above a minimum voltage of 0.8 volts, which narrows the range of voltages for node F and therefore shortens the necessary transition time for node F to fully adjust to a new voltage at node E, particularly when node F adjusts from a logic low level to a logic high level. Also, by using transistor 124 to raise the minimum voltage at source 120 of transistor 114, the trip voltage of the inverter formed by transistors 106 and 114 is further skewed higher than the normal CMOS inverter trip voltage of 2.5 volts, because gate 112 of transistor 114 must therefore, apply a higher voltage for transistor 114 to conduct current.

Although the present invention and its advantages have been described in detail, it should be understood that various changes, substitutions and alterations can be made herein without departing from the spirit and scope of the invention as defined by the appended claims.

What is claimed is:

1. An apparatus for translating voltages comprising:
   an input section for generating first and second control voltages within a voltage range responsive to an input signal;
   a level shifter section comprising first and second inverters respectively coupled to said control voltages, said inverters comprising a plurality of transistors, wherein each transistor maintains current responsive to one of said control voltages being anywhere within said voltage range, such that outputs of said first and second inverters are operable to transition quickly responsive to a transition of said first and second control voltages, respectively; and
   an output section for generating an output signal responsive to said outputs of said first and second inverters.

2. The apparatus of claim 1 wherein each of said first and second inverters comprises a p channel field effect transistor and an n channel field effect transistor.

3. The apparatus of claim 2 wherein the channel of said p channel field effect transistor is over twice as wide as the channel of said n channel field effect transistor.

4. The apparatus of claim 1 wherein said level shifter section further comprises a bias voltage device coupled to one of said inverters and operable to maintain the output of said one inverter above a desired bias voltage, such that said one inverter is operable to quickly adjust said output of said one inverter away from said bias voltage responsive to a transition of a respective one of said control voltages.

5. The apparatus of claim 4 wherein said bias voltage device comprises:
   a first npn bipolar transistor having an emitter coupled to a first reference voltage, a collector and a base, said collector coupled to said base and to said one inverter; and
   a second npn bipolar transistor having an emitter coupled to said base of said first npn transistor, a collector coupled to a second reference voltage, and a base coupled to a third reference voltage.

6. The apparatus of claim 1 wherein said output section comprises an npn bipolar transistor for providing high current drive capability for said output signal, having a base coupled to one of said inverter outputs, an emitter coupled to said output signal, and a collector coupled to a reference voltage.

7. The apparatus of claim 1 wherein said output section comprises:
   an n channel field effect transistor having a gate coupled to one of said inverter outputs, a drain coupled to said output signal, and a source; and
   an npn bipolar transistor for providing high current drive capability for said output signal, having a base coupled to the source of said n channel transistor, a collector coupled to said output signal, and an emitter coupled to a reference voltage.

8. The apparatus of claim 1 wherein said input section comprises a differential amplifier coupled to said input signal and to a reference voltage operable to generate said first and second control voltages.

9. An apparatus for translating voltages comprising:
   an input section for generating first and second control voltages within a voltage range responsive to an input signal;
   a level shifter section comprising first and second inverters respectively coupled to said control voltages, each of said inverters comprising a p channel field-effect transistor and an n channel field-effect transistor, wherein the channel of said p channel field-effect transistor is over twice as wide as the channel of said n channel field-effect transistor, and wherein each transistor maintains current responsive to one of said control voltages being anywhere within said voltage range, such that outputs of said first and second inverters are operable to transition quickly responsive to a transition of said first and second control voltages, respectively; and
   an output section for generating an output signal responsive to said outputs of said first and second inverters.

10. The apparatus of claim 9 wherein said level shifter section further comprises a bias voltage device coupled to one of said inverters and operable to maintain the output of said one inverter above a desired bias voltage, such that said one inverter is operable to quickly adjust said output of said one inverter away from said bias voltage responsive to a transition of a respective one of said control voltages.

11. The apparatus of claim 10 wherein said bias voltage device comprises:
   a first npn bipolar transistor having an emitter coupled to a first reference voltage, a collector and a base, said collector coupled to said base and to said one inverter; and
   a second npn bipolar transistor having an emitter coupled to said base of said first npn transistor, a collector coupled to a second reference voltage, and a base coupled to a third reference voltage.

12. The apparatus of claim 9 wherein said output section comprises an npn bipolar transistor for providing high current drive capability for said output signal, having a base coupled to one of said inverter outputs, an emitter coupled to said output signal, and a collector coupled to a reference voltage.

13. The apparatus of claim 9 wherein said output section comprises:
   an n channel field effect transistor having a gate coupled to one of said inverter outputs, a drain coupled to said output signal, and a source; and
   an npn bipolar transistor for providing high current drive capability for said output signal, having a base coupled to the source of said n channel transistor, a collector coupled to said output signal, and an emitter coupled to a reference voltage.

14. The apparatus of claim 9 wherein said input section comprises a differential amplifier coupled to said input signal and to a reference voltage operable to generate said first and second control voltages.

15. A method for translating voltages comprising the steps of:
   generating first and second control voltages within a voltage range in response to an input signal;
   maintaining current through each of a plurality of transistors in response to one of said control voltages being anywhere within said voltage range, said transistors forming first and second inverters respectively coupled to said control voltages, such that outputs of said first and second inverters transition quickly in response to a transition of said first and second control voltages, respectively; and generating an output signal in response to said outputs of said first and second inverters.

16. The method of claim 15 wherein said step of maintaining current comprises the step of maintaining current through a p channel field effect transistor and through an n channel field effect transistor together forming one of said inverters.

17. The method of claim 16 wherein said step of maintaining current comprises the step of maintaining current through the channel of said p channel field effect transistor being over twice as wide as the channel of said n channel field effect transistor.

18. The method of claim 15 wherein said step of generating first and second control voltages comprises the step of generating said first and second control voltages with a differential amplifier coupled to said input signal and to a reference voltage.

19. The method of claim 15 and further comprising the step of maintaining the output of one of said inverters above a desired bias voltage, such that said one inverter quickly adjusts said output of said one inverter away from said bias voltage in response to a transition of a respective one of said control voltages.

* * * * *